United States Patent [19]
Labrunie et al.

[11] Patent Number: 5,125,000
[45] Date of Patent: Jun. 23, 1992

[54] COMPACT ELECTRONIC PUMPING-TYPE SEMICONDUCTOR LASER

[75] Inventors: Guy Labrunie, Saint Ismier; Engin Molva, Grenoble, both of France

[73] Assignee: Commissariat A l'Energie Atomique, France

[21] Appl. No.: 680,322

[22] Filed: Apr. 4, 1991

[30] Foreign Application Priority Data

Apr. 25, 1990 [FR] France .................. 90 05268

[51] Int. Cl.$^5$ .................................. H01S 3/091
[52] U.S. Cl. .......................... 372/75; 372/74; 372/34
[58] Field of Search ............. 372/74, 75; 357/55, 357/34

[56] References Cited

U.S. PATENT DOCUMENTS

| | | | |
|---|---|---|---|
| 3,803,510 | 4/1974 | Nicoll | 331/94.5 |
| 3,942,132 | 3/1976 | Zinn | 331/94.5 |
| 4,328,443 | 5/1982 | Zappa | 372/74 |
| 4,513,308 | 4/1985 | Greene et al. | 357/55 |
| 4,631,731 | 12/1986 | Wolter et al. | 372/74 |
| 4,903,088 | 2/1990 | Van Opdorp | 372/74 |

FOREIGN PATENT DOCUMENTS 0119646 2/1984 European Pat. Off. .
01300558 5/1988 Japan .

OTHER PUBLICATIONS

Soviet Journal of Quantum Electronics vol. 10 No. 6 Jun. 1980.
Soviet Journal of Quantum Electronics vol. 17 No. 9 Sep. 1987.

*Primary Examiner*—Léon Scott, Jr.
*Attorney, Agent, or Firm*—Hayes, Soloway, Hennessey & Hage

[57] ABSTRACT

A laser having a volume of less than 1 cubic centimeter comprises a semiconductor constructed to permit the emission of a coherent beam of electromagnetic radiation upon the application of an electron beam to one of its surfaces, and an electron bombardment pumping device for applying the electron beam. The electron bombardment device includes at least one microdot emissive cathode cold electron source having a volume less than 1 cm$^3$. In a preferred embodiment the laser comprises a plurality of electron bombardment devices formed into a matrix or row of microdot cathodes. A focusing device is provided for focusing the electron beams onto a plurality of excitement strips corresponding to a plurality of semiconductors.

14 Claims, 5 Drawing Sheets

FIG. 3
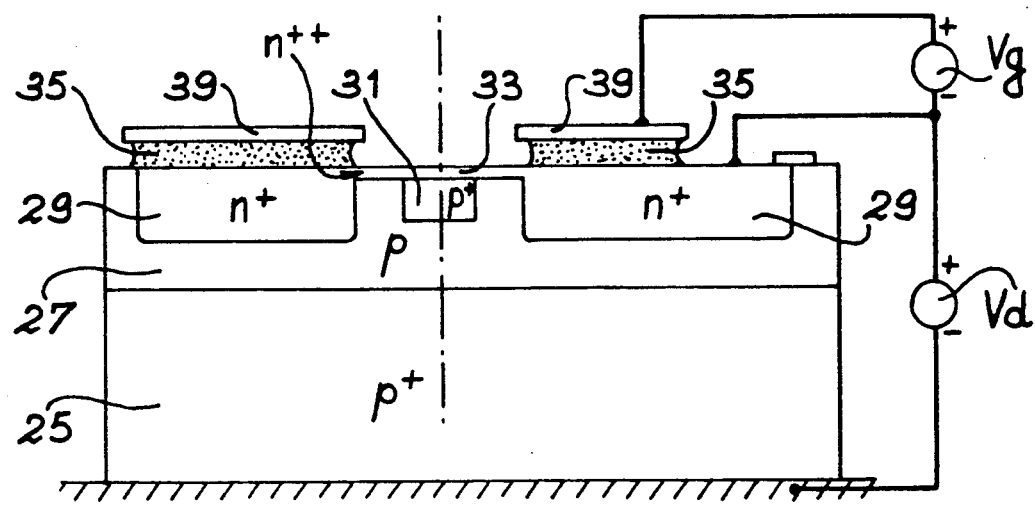
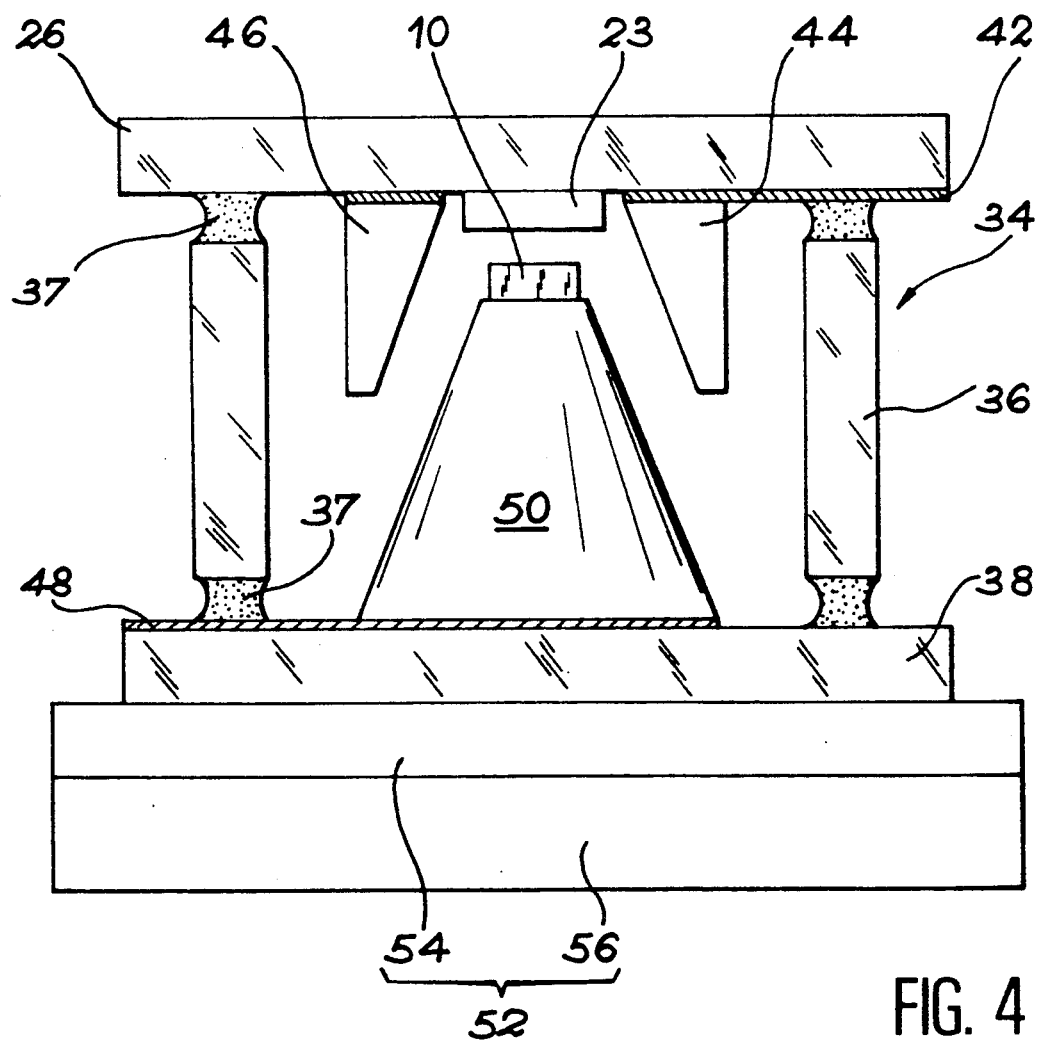
FIG. 4

COMPACT ELECTRONIC PUMPING-TYPE SEMICONDUCTOR LASER

FIELD OF THE INVENTION

The present invention relates to a compact electronic pumping-type semiconductor laser. It applies to all types of optical information treatment or processing. It can be used in audio or video compact disk readers, in optical memory systems, in laser printers or bar code readers. It can also be used in optical recording and in laboratory instrumentation.

BACKGROUND OF THE INVENTION

There are three types of semiconductor lasers using semiconductor alloys as the laser cavity and these are distinguished by their laser effect generating modes. They are in fact injection laser diodes, electronic pumping lasers and optical pumping lasers.

BRIEF DESCRIPTION OF THE PRIOR ART

The main existing compact commercial products are injection III-V laser diodes. The construction of laser diodes requires the use of complex dosing and thin film metallurgical technologies, which can only be used in connection with semiconductors from the family of III-V compounds based on Ga, Al, In, As, P and Sb atoms. The main advantage of III-V laser diodes is their compactness, i.e. their small overall dimensions of approximately 1 cm$^3$. However, the major disadvantage of III-V laser diodes is the limitation to the emission wavelength range to between 0.6 and 1.55 micrometer, which is due to the fact that it is only possible to use III-V materials.

Among the other types of known semiconductor lasers, electronic pumping lasers use an electron bombardment for exciting the semiconductor. Conventionally the electronic pumping is carried out with the aid of an electron gun. Such a construction is described in the article by A. Nasibov "Laser cathode ray tubes and their applications", SPIE Vol. 893 High power Laser Diodes and Applications. The main advantage of these lasers is the subdivision of the "pumping source" and "laser cavity" functions, which makes it possible to use all the direct gap semiconductors and in particular those not permitting direct injection, i.e. the construction of injection laser diodes. The use of all the direct gap semiconductors makes it possible to extend the wavelength range from the ultraviolet to the infrared.

However, in electronic pumping semiconductor lasers, the current density used is approximately 10 to 100 A/cm$^2$ and the acceleration voltage used is approximately 20 to 100 kV. These high values prevent the construction of a reduced volume semiconductor laser (approximately 1 cm$^3$), which is compact and has the dimensions and advantages comparable to those of III-V laser diodes. Due to the high energy densities, only the pulsed operating mode is possible and their application is limited to laser uses for display purposes.

SUMMARY OF THE INVENTION

One aim of the present invention is the production of a compact electronic pumping semiconductor laser having a reduced volume (approximately 1 cm$^3$), comparable to that of III-V laser diodes, whilst having the specific advantages of electronic pumping semiconductor lasers.

Another aim of the invention, linked with the specific advantages of electronic pumping lasers, is to allow the construction of lasers supplying light beams in a wavelength range from the ultraviolet to the mid-infrared and which are dependent on the nature of the semiconductor materials used.

The invention makes it possible to achieve these aims by using in a compact device on the one hand a compact electron source and on the other a compact semiconductor laser cavity having a particular structure in order to obtain a low current threshold and a low electron acceleration voltage.

More specifically, the present invention relates to a semiconductor laser incorporating an electron bombardment pumping device characterized in that the latter is a cold electron source with a volume below 1 cm$^3$.

The pumping device can be chosen from among cold electron sources with a PN, PIN or Schottky junction, a tunnel effect metal-isolator-metal structure, or using ferroelectric materials.

In a preferred manner use is made of cold electron sources produced by microelectronic methods, which facilitates the mass production of the devices. Preferably, the pumping device is a microdot emissive cathode cold electron source.

It is also possible to use with advantage a cold electron source constituted by reverse biased PN junctions silicon cathodes.

These two latter types of sources can have a mosaic, matrix or mosaic matrix structure.

The semiconductors used are of the direct gap type and are e.g. chosen from among III-V and II-VI compounds and make it possible to cover the wavelength range extending from the ultraviolet to the infrared.

In order to obtain laser beams in a wide wavelength range, the semiconductor is preferably a II-VI compound.

The semiconductor is in the form of a Fabry-Perot resonant cavity, whose mirrors are produced by cleaving and optionally by the deposition of thin optical films with a view to controlling the reflectivity of the mirrors. Optionally, the resonant cavity can be of the distributed cavity type, e.g. a distributed feedback cavity or a distributed Bragg reflector cavity.

The laser device can be of the gain guidance or index guidance type.

The laser cavity can be produced from a solid semiconductor material, or a thin film deposited on a substrate. The thin film structure of the semiconductor can have several heterostructures.

The semiconductor preferably has a structure with a laser effect for a current density with an electronic threshold below 10 A/cm$^2$ and for an electron acceleration voltage below 10 kV.

The term "structure" is understood to mean the composition, the doping of the semiconductor and the parameters of the heterostructures if they exist, as well as the characteristics, geometrical dimensions of the resonant cavity and the type of the latter, i.e. Fabry-Perot or distributed, and the guidance structure by gain or index.

A low threshold current and a low acceleration voltage make it possible to considerably lower the energy densities deposited on the semiconductor. By simplifying the assembly of the laser device and by using a cold electron source with a volume below 1 cm$^3$, this makes it possible to obtain a compact laser having the advantages referred to hereinbefore.

The semiconductor advantageously has a heterostructure. According to a particular embodiment of the invention, said heterostructure is multiple. It can be formed from alloys based on Cd, Zn, Mn, Hg, Te, Se, S, etc.

This heterostructure produced by thin film epitaxy on a substrate comprises several zones, namely a surface zone for electronic excitation and generation of electron-hole pairs, an active zone for the confinement of the carriers and for the generation of the laser light resulting from the radiative recombination of the electron-hole pairs and a laser light optical confinement zone.

The electronic excitation zone can optionally have a gap gradient, with the gap decreasing from the inside of the film, in order to effectively make the generated carriers migrate towards the active zone.

The two confinement zones can be separated or coincide. They are generally separate from the excitation zone, which is located close to the surface. The active zone is generally within the optical confinement zone. The active zone can be constituted by a single well, a quantum well, a quantum multiwell, a superlattice, or a combination of these structures.

According to a special embodiment, the laser comprises a vacuum enclosure having a transparent window for supplying a laser beam, a first face of the said enclosure supporting the cold electron source, contained in the said enclosure at least one semiconductor able to produce a laser beam and contained within said enclosure and fixed facing the cold electron source, at least one electrode able to keep the semiconductor at a given distance and facing the cold electron source.

Advantageously, said electrode has a shape suitable for the focussing onto the semiconductor of electric field lines from the cold electron source. This shape can e.g. be conical or pyramidal, the semiconductor being located at the apex.

In a special embodiment, the laser comprises means for the focussing along a strip of the electrons from the cold electron source. Preferably, said means are constituted by conductor screens located on either side of the electron beam and having a geometry suitable for focussing.

Advantageously, the laser comprises a cooling system also making it possible to regulate parameters of the light beam supplied. This system can e.g. consist of a radiator or a Peltier effect thermoelectric cooler.

BRIEF DESCRIPTION OF THE DRAWINGS

The invention is described in greater detail hereinafter relative to non-limitative embodiments and with reference to the attached drawings, wherein show:

FIG. 3 diagrammatically an emitter of a silicon cathode cold electron source.

FIG. 4 diagrammatically a section through a laser according to the invention.

DETAILED DESCRIPTION OF THE DRAWINGS

According to the invention, the active material of the laser has a structure with a laser effect for an electron threshold current density below 10 A/cm$^2$ and for an electron acceleration voltage below 10 kV.

A multiple II-VI compound heterostructure (e.g. CdZnTe semiconductor alloys) complies with the said criteria. Such a structure can be produced by molecular beam epitaxy. Deposition is carried out on a solid CdZnTe or GaAs semiconductor alloy substrate having a particular crystalline orientation, e.g. <100>. The surface of the substrate is approximately 1 cm$^3$. Once the heterostructure has been deposited, the substrate is made thinner and is in fact brought to a thickness between 50 and 200 micrometers.

This is followed by the production of "matches", i.e. rectangular semiconductor crystals, whose two parallel faces serve as mirrors for forming the Fabry-Perot-type resonant cavity of the laser. These "matches" are e.g. obtained by cleaving mirror faces and cutting with the saw the heteroepitaxied substrate bonded to a flexible metal sheet.

A "match" has a length between 200 and 2000 micrometers (which corresponds to the spacing between two cleavage planes) and a width between 50 and 2000 micrometers (spacing between two saw cutting lines).

The mirrors of the laser resonant cavity are the cleavage faces. It is optionally possible to deposit on the latter one or more optical films (of $Al_2O_3$, $SiO_2$ or any other appropriate material) in order to increase the reflectivity and optionally so that one of the two mirrors has a reflection coefficient close to 100%.

Figure 1A:
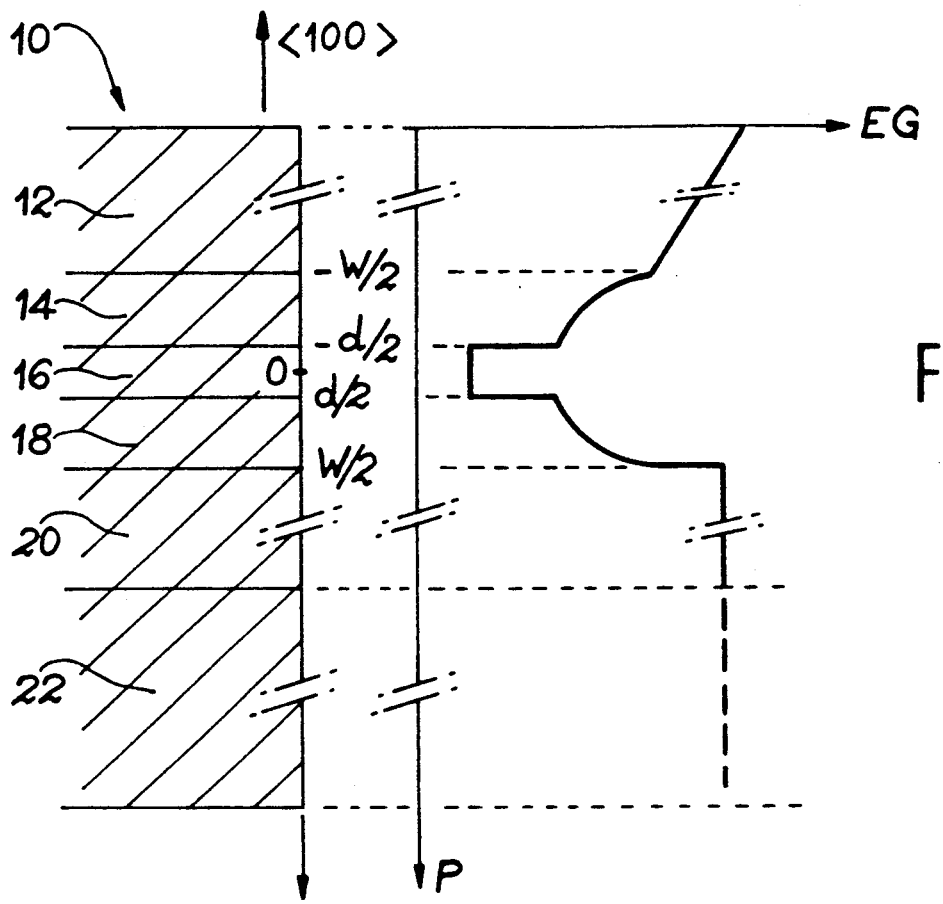
FIG. 1A, diagrammatically, a heterostructure of a II-VI compound used as the active material of a laser according to the invention and the energy of the gap of each of the heterostructure zones.
Figure 1B:
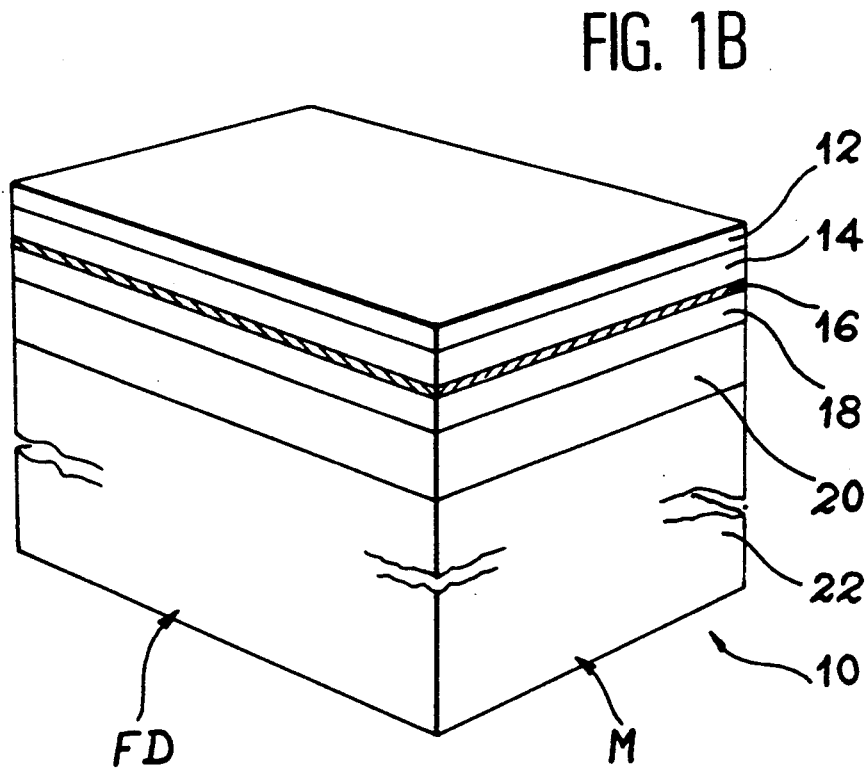
FIG. 1B the Fabry-Perot cavity produced by cutting and cleaving the semiconductor.

FIGS. 1A and 1B show the thin film heterostructure of the semiconductor 10 and the energy of the gap EG (forbidden energy zone between the valency band and the conduction band of the alloy in question) of each zone as a function of the depth P. The origin of the depth P is chosen in the centre of the active zone of the semiconductor.

In the represented embodiment, the semiconductor 10 constituting the active material of the laser comprises an electronic excitation zone 12, an active confinement zone of the carriers 16, an optical confinement zone formed by 14, 16 and 18, a buffer layer zone 20 and the substrate 22.

The first excitation zone 12 passes from the surface to a dimension $-w/2$, its thickness being between 0.05 and 2 micrometers. In the said zone 12, the composition of the semiconductor corresponds to the formula $Cd_zZn_{1-z}Te$, in which z varies from zs (on the surface) to zw/2 (at the dimension $-w/2$). For example, zs and zw/2 can be respectively equal to 0 and 0.1. In said zone 12, the gap has a large value at the surface and e.g. decreases linearly. It has a decreasing gradient of the gap. The electron-hole pairs, created by the electron bombardment, are generated in the zone 12. It makes it possible to collect the carriers produced close to the surface and to make them migrate towards the active zone 16.

The second zone 14 is defined by the dimensions $-w/2$ and $-d/2$, the thickness of said zone being e.g.

0.05 to 0.3 micrometer. In zone 14 the composition of the semiconductor corresponds to the formula CdyZn1-yTe, in which y varies from zw/2 to yd/2. For example, yd/2 can be between 0.2 and 0.4. The zone 14 has a decreasing gap gradient. The decrease can be abrupt and the composition can abruptly pass from zw/z to yd/2 at dimension −w/2 and remain constant, or can decrease slowly as is e.g. the case in FIG. 1.

The active zone 16 has a small gap for the confinement of the carriers and for generating the laser light. This zone 16 extends between −d/2 and d/2 and e.g. has a thickness between 0.002 and 0.2 micrometer. The composition of the semiconductor in this zone corresponds to the formula CdxZn1-xTe with x being constant and e.g. between 0.5 and 1. The active zone 16 can be constituted by a single well or a quantum well, as is e.g. the case in FIG. 1, or a quantum multiwell, or a superlattice, or a combination of these structures.

Zone 18, which is symmetrical with respect to zone 14, extends from d/2 to w/2 and e.g. has a thickness of 0.05 to 0.3 micrometer. The semiconductor composition in this zone corresponds to the formula CdyZn1-yTe, in which y varies between the values yd/2 and zw/2. Therefore the zone 18 has a gap gradient which rises symmetrically from the gap of zone 14. This increase can be abrupt, or slow as is e.g. the case in FIG. 1. The laser light optical confinement zone is constituted by zones 14, 16 and 18 and has a total width W of e.g. between 0.1 and 0.6 micrometer.

The buffer zone 20 with a thickness between e.g. 0.1 and 3 micrometers is produced on the substrate 22. This zone makes it possible to adapt the mesh parameter to that of the substrate and reduce the density of defects. It also makes it possible to confine the light in the optical confinement zone. It can be a single layer, a multilayer structure, a superlattice structure or a combination of these structures. In the embodiment shown, the composition of the semiconductor within the buffer zone corresponds to CdZnTe. It has a larger gap than that of the optical confinement zone. The substrate 22 can e.g. be of CdZnTe or GaAs. With the aforementioned numerical values, the appropriately excited heterostructure emits a laser beam centered on a wavelength between 0.55 and 0.75 micrometer.

FIG. 1B shows the Fabry-Perot-type resonant cavity. It is possible to see a face FD on the side produced by cutting and a face M produced by cleaving and serving as a mirror for the Fabry-Perot cavity.

The structure of the laser cavity shown in exemplified manner in FIG. 1B is suitable for a gain guidance type. Other known structures of the index guidance type can also be used.

According to the invention, the semiconductor 10 is pumped by an electron bombardment produced by a cold electron source 23, e.g. by a network, i.e. a mosaic, a matrix or a mosaic matrix of field effect cold electron emission microdot cathodes. Such a network and examples of the production processes are described in French patent application 86 01 024 and 87 15 432.

Figure 2A:
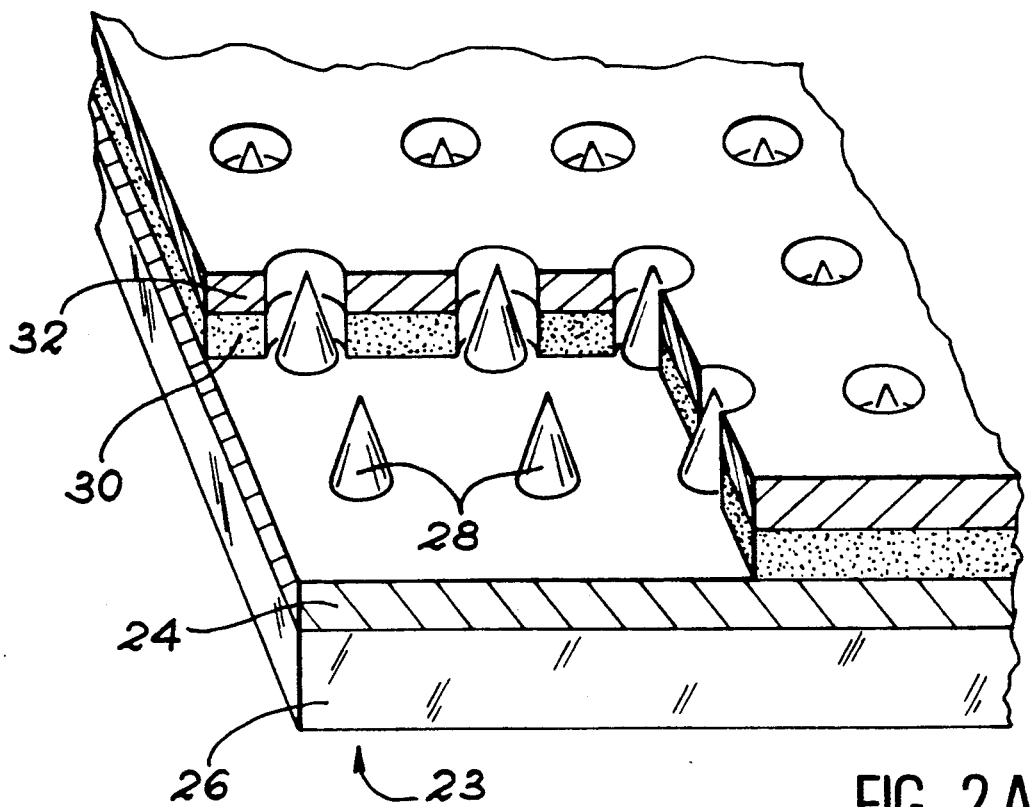
FIGS. 2A and 2B diagrammatically a mosaic and a matrix of microdot cathodes respectively used as the cold electron source.

With reference to FIG. 2A, a brief description will be given of the structure of a mosaic of microdot cathodes and the characteristics thereof. The mosaic is constituted by a conductive layer 24 deposited on a substrate 26, which can be of an insulating nature, e.g. of glass, or of a semiconducting nature, e.g. of silicon and having a thickness between 0.2 and 0.5 millimeter. This conductive layer has conductive microdots 28.

The microdots have a base diameter of approximately 1.5 micrometer and are e.g. spaced by 3 or 10 micrometers. Thus, there are e.g. between 10,000 and 100,000 microdots per $mm^2$. This is covered by an insulating layer 30 provided with openings allowing the microdots 28 to point towards the outside. The insulating layer 30 is approximately 1 micrometer thick.

The insulating layer 30 is covered by a conductive layer having openings facing the dots 28. The openings have a diameter of approximately 1.5 micrometer. The said conducting layer forms the extraction grid.

During the application of adequate potentials to the conductive layers 24 and 32, the microdots 28 emit electrons by field effect.

Figure 2B:
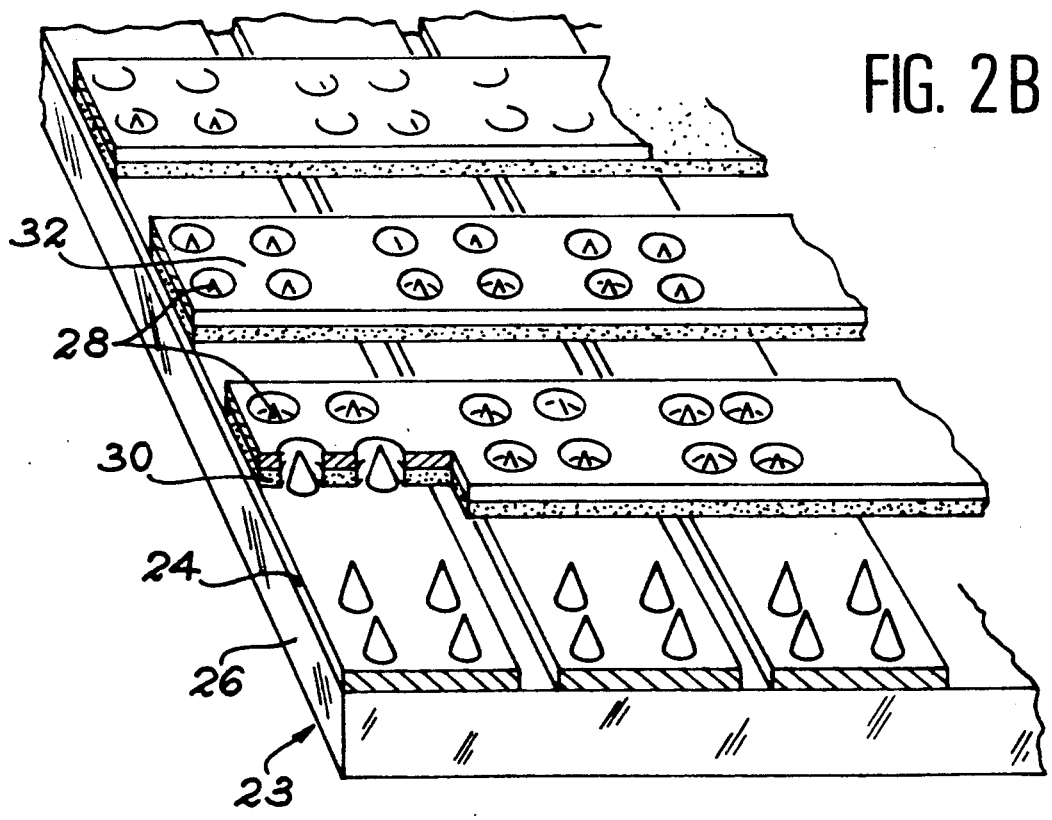

FIG. 2B shows a matrix variant of the microdot network, which is called a microdot matrix or array. In this structure, the conductive layers 24 and 32 are arranged in columns and rows, which are isolated from one another. At the intersection of each row 32 and each column 24, there can be one or more microdots.

During the application of adequate potentials to the column conductors 24 and row conductors 32, the microdots 28 located at the intersection of a row and a column raised to the said potentials emit electrons. Thus, by selective application of these potentials to the rows and columns, it is possible to choose the emission zone of the electrons.

The emitted electron density is a function of the values of the potentials applied. The current density can be between 1 and 10 $mA/mm^2$. The current emitted is e.g. between 0.1 and 5 mA. The total current is dependent on the one hand on the potentials applied and on the other on the number and density of the microdots, as well as the surface of the microdot network. The network e.g. has a rectangular surface between 0.1 and 0.5 $mm^2$.

The cold electron source 23 can also be constituted by a network of emitters with silicon cathodes. FIG. 3 diagrammatically shows in section such an emitter. A complete description of such emitters is e.g. provided in the article by G. G. P. Van Gorkom and M. Moeberechts, Philips Technical Review, Vol. 43, No. 3, pp. 49-57, 1987. A 6 micrometer thick, p-type, Si epitaxied layer 27 is located on a 400 micrometer thick, $p^+$ type Si substrate 25. For the electrical contacts, phosphorus is diffused in order to form a 3 micron thick $n^+$ layer 29. The $p^+$ cylindrical active zone 31 with a diameter d smaller than 10 micrometers is produced by boron implantation. Its typical concentration is $5 \times 10^{17}$ $cm^{-3}$. By arsenic or antimony implantation an approximately 10 nm thick $n^{++}$ film 33 is produced on said zone 31. This $n^{++}$ film is very highly doped, typically $4 \times 10^{19}$ $cm^{-3}$. The emission zone corresponding to the P-N junction at the interface of zones 31 and 33 has a cylindrical symmetry and a diameter below 10 micrometers.

This leads to two P-N junction diodes, respectively constituted by the zones 27, 29 and 31, 33 connected in parallel.

An insulant 35, e.g. of 1 micrometer thick $SiO_2$ and which forms a cylindrical piece on which rests a 0.5 micrometer thick conductive layer 39 and which is e.g. of aluminium, makes it possible to shield the electric fields, limit the charging of the insulant and optionally serve as an electrode in an electronic optical system.

A brief description will now be given of the operation of such a cathode. Reverse biasing takes place of the P-N junctions using the voltage Vd. A very high electrical field of approximately $10^6$ V/cm is produced. This field in the depletion zone of the diode produced by the p+/n++ junction of the zones 31, 33, accelerates the electrons from the p+ zone 31 to the n++ zone 33. These accelerated "hot" electrons create an "avalanche effect" by creating, by collision with the valence electrons, other electron-hole pairs. Part of the electrons (approximately 1.5%) reaching the n++ side 33, have a kinetic energy higher than the separation energy and are emitted. Vd is typically between 6 and 9 V. The current of the diode is a few mA. The current density and the electron emission current for a diameter of 1 micrometer (p+/n++ junction produced by the layers 31, 33) are respectively 1,500 A/cm$^2$ and 10 microamperes. Generally, in order to reduce the separation energy of the electrons, a monoatomic cesium layer is deposited on the surface. For diameters between 1 and 6 micrometers of the active zones 31, 33, the emission current varies between 10 and 60 microamperes.

The production processes use microelectronic technology and make it possible to produce chips having several cathodes forming a network.

Figure 5:
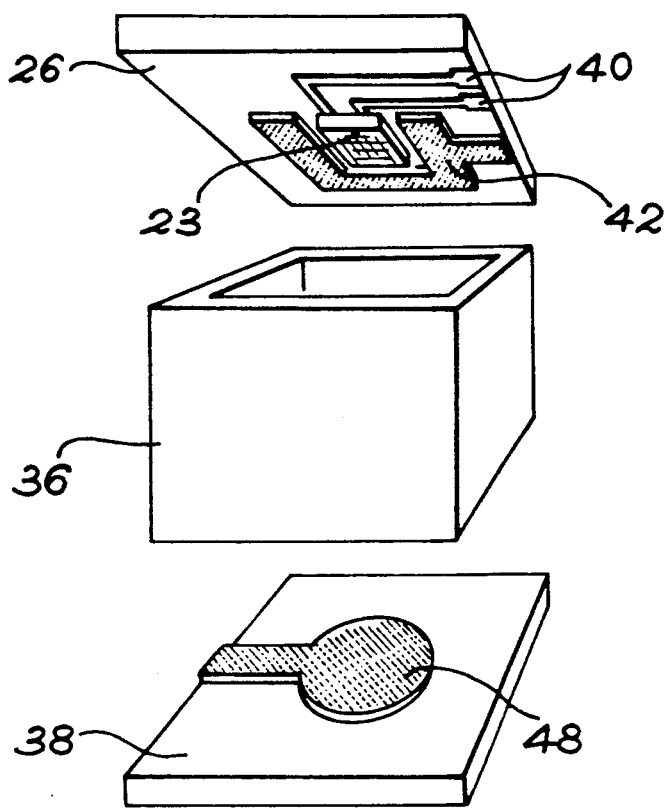
FIG. 5 diagrammatically and in exploded form, a vacuum enclosure according to the invention.

With reference to FIGS. 4 and 5, a description will now be given of an embodiment of a laser according to the invention.

The semiconductor 10, cut and treated in the manner indicated hereinbefore, is kept facing the cold electron source 23, e.g. a microdot cathode network, at a predetermined distance e.g. between 1 and 10 mm. In this example, pumping is transverse and the semiconductor 10 emits a laser beam by one of its faces parallel to the plane of the sheet forming the support for the drawing.

The assembly formed by the semiconductor 10 and the pumping device 23 is kept under a secondary vacuum in an enclosure 34. The enclosure 34 is constituted by a microtube 36, e.g. having rectangular faces closed on two opposite sides by two insulating material plates 26, 38, e.g. of glass.

The enclosure 34 has at least one window transparent at the wavelength of the laser beam. In the embodiment shown, the microtube 36 is of optical quality glass and consequently serves as a window. The plates 26, 38 are welded to the microtube 36 by welds 37, e.g. of fusible glass, as a result of local laser heating, or some other heating procedure.

The network 23 is e.g. directly produced on a plate 26. As can be seen in FIG. 4, conductive tracks 40, e.g. of copper, permit the polarization of the conductors of the network 23. A supplementary conductive track 42 of an appropriate geometry makes it possible to fix and polarize the focussing means 44, 46.

FIG. 4 shows that the plate 26 projects beyond the microtube 36 in such a way as to permit an electrical connection to the conductive tracks 40, 42. The focussing means are constituted by two conductive screens 44, 46, e.g. of copper, which are welded to the conductive track 42 on either side of the network 23.

FIG. 5 shows an e.g. copper conductive track 48 deposited on the other plate 38. This track 48 permits the welding of an e.g. copper electrode 50. The electrode 50 maintains the semiconductor 10 at a predetermined distance from and facing the network 23.

The electrode 50 has a geometry suitable for the focussing onto the semiconductor 10 of the electric field lines from the network 23. In the embodiment shown in FIG. 4, the electrode 50 is cone-shaped. The substrate of the semiconductor 10 is e.g. indium bonded to the apex of the said cone, so that the epitaxied layers face the network 23. The electrode 50 can also be shaped like a pyramid, or can be given any other shape making it possible to focus the field lines. The electrode 50 also makes it possible to remove the heat stored in the semiconductor 10 during electron bombardment. The plate 38 projects beyond the microtube 36 in such a way as to permit an electrical connection to the track 48.

The different elements are assembled under a secondary vacuum. The assembly is stoved (under vacuum) at a temperature between 150° and 200° C. Optionally, the plate 26 provided with the network 23 and the screens 44, 46 is separately stoved at a higher temperature. The plates 26 and 38 are reciprocally positioned by an optical method.

In this embodiment, the laser comprises a cooling device 52 incorporating a copper radiator 54 on the one hand in contact with the outer face of the plate 38 and on the other in contact with a miniature Peltier effect thermoelectric cooler 56. The temperature within the enclosure 34 can be regulated, but also controlled. It is known that the laser emission wavelength is dependent on the temperature. It is therefore possible to slightly vary or stabilize the emission wavelength by varying or stabilizing the temperature of the enclosure 34 and the semiconductor 10. Cooling also make it possible to remove the excess heat, which can result from electronic excitation.

Figure 6:
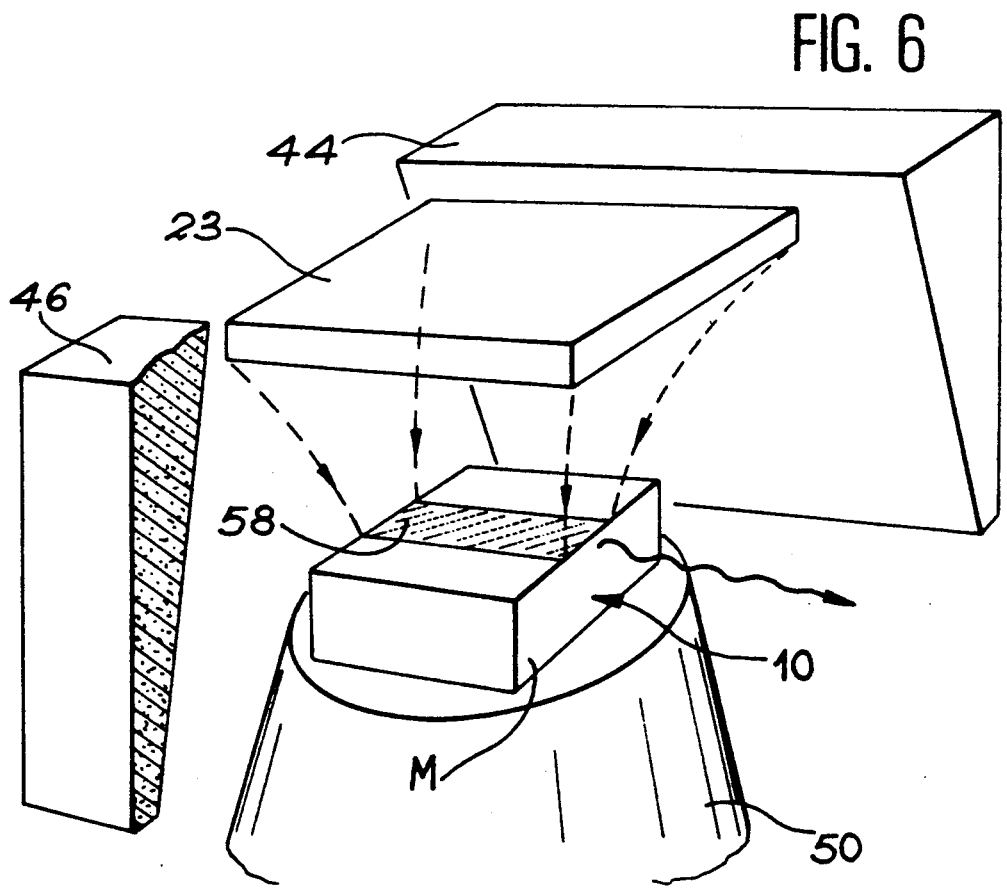
FIG. 6 diagrammatically and in partial view a laser according to the invention.

FIG. 6 diagrammatically shows a partial view of the device of FIG. 4. The focussing screens 44, 46 are positioned on either side of the network 23 and the semiconductor 10. They have a geometry suitable for the focussing of the electrons onto a ribbon or strip 58 of the surface of the semiconductor 10, when they are raised to an adequate potential. This makes it possible to control the width of the excitation strip and therefore the surface, together with the electronic excitation current density. This focussing control consequently makes it possible to obtain sufficiently high current densities beyond the laser beam generation threshold, whilst still maintaining low currents and a low deposited energy. This also makes it possible to control the width of the emission band of the light beam and consequently the geometrical characteristics of the latter. In the embodiment shown the screens 44, 46 are trapezoidal.

An example will now be given of the numerical values suitable for the operation of a laser like that of FIG. 4.

The microdots are grounded. The grids 32 are polarized between 0 and 150 V. The grid potential controls the electron current. The emission of electrons is brought about by an electrical field of approximately 10$^7$ V/cm at the level of the microdots. The screens 44,46 are polarized at between −500 and +500 V. The semiconductor is polarized to a positive potential value between 3 and 10 kV. The field lines produced by the potential difference between the grids 32 and the semiconductor 10 bring about a convergence of the electrons emitted by the microdots on a rectangular surface of the semiconductor 10. The thus defined laser cavity has a length between 200 and 500 micrometers (length of the semiconductor alloy "match") and a width between 10 and 300 micrometers (with focussing by the screens 44,46). This width is dependent on the focussing of the beam, which is dependent on the shape of the screens 44,46, and the potentials applied. In the present embodiment, the guidance structure is of the gain guidance type, i.e. the laser light will be confined in the zone defined by the excitation strip 58.

The electrons reaching the surface of the semiconductor 10 only slightly penetrate the surface layer to a thickness less than 1 micron. They create electron-hole pairs with a maximum yield of approximately 30%. The gap gradient (zones 12 and 14 in FIG. 1) leads to the migration of the carriers towards the active zone (16 in FIG. 1), where they are confined. The recombination of the carriers produces light, whose wavelength is dependent on the characteristics of the alloys and the structure constituting the active zone.

The laser effect is obtained for a current density threshold below 10 $A/cm^2$. The laser beam is supplied across one face of the microtube 36.

The power deposited by the electron bombardment is below a few dozen $kW/cm^2$ and a large part of this is transformed into heat, being evacuated to the outside by the electrode 50.

Figure 7:
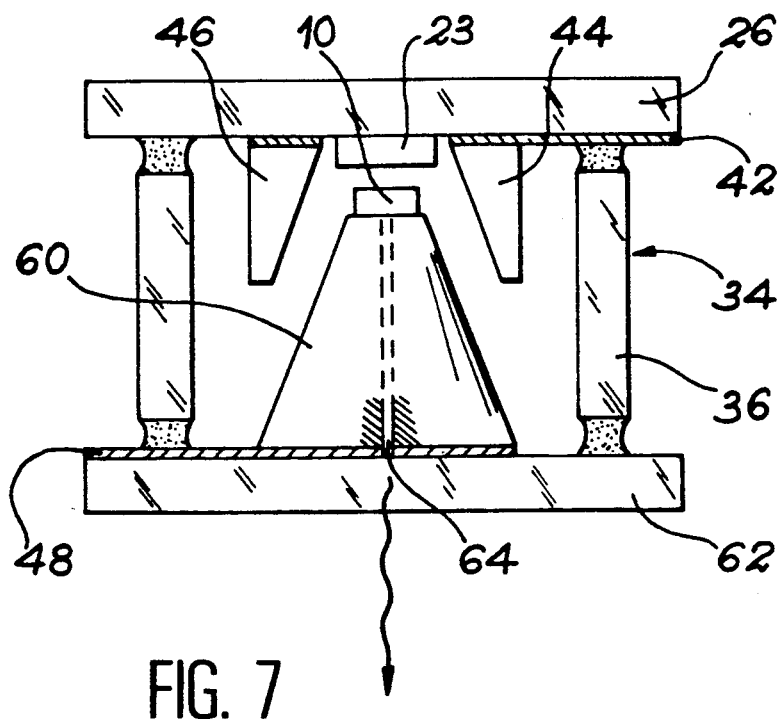
FIG. 7 diagrammatically and in section a variant of a laser according to the invention.

FIG. 7 diagrammatically shows a sectin of a laser according to the invention, but which has longitudinal pumping. The components identical to those of FIG. 4 have the same references.

In this embodiment, the electrode 60 supporting the semiconductor 10 is perforated by a tunnel 64 (which can also be hollow) and which issues onto the plate 62 closing the microtube 36. The conductive strip 48 has a geometry such that it does not close the outlet of the tunnel 64.

The plate 62 is made from an insulating material transparent at the wavelength of the laser beam and must be of optical quality.

In this embodiment, the facing faces of the semiconductor 10 serve as mirrors producing the resonant cavity of the laser. The mirrors are produced by deposits of optical films.

Figure 8:
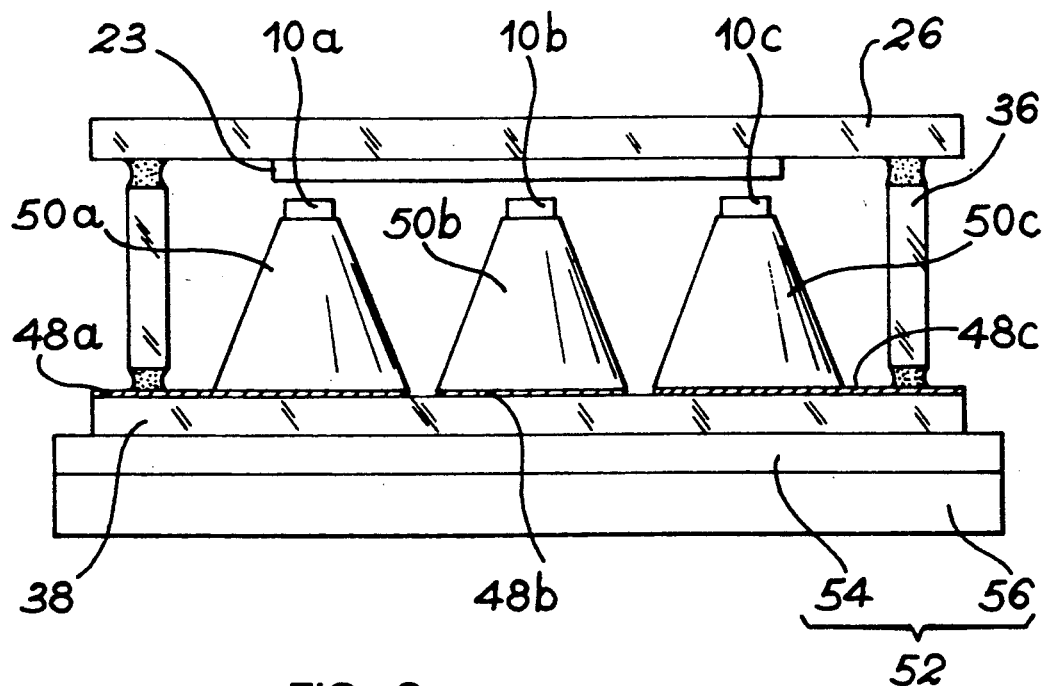
FIG. 8 diagrammatically and in section another variant of a laser according to the invention.

FIG. 8 diagrammatically shows in section another embodiment of a laser according to the invention. The components which are identical to those of FIG. 4 carry the same references. In this embodiment, the laser has three semiconductors 10a, 10b, 10c with identical or different structures and able to emit laser beams of identical or different wavelengths. These three semiconductors 10a, 10b, 10c are respectively fixed to the apex of the three electrodes 50a, 50b, 50c, which keep them at a predetermined distance and facing the microdot cathode matrix 23.

As a result of the possibility of selectively addressing the rows and columns of a microdot emissive cathode matrix 23, it is possible to excite one or all the semiconductors 10a to 10c at once.

A laser according to the invention only occupies a reduced volume, which can be approximately 1 $cm^3$. It is compact and does not require a large electric power supply. The use of a microdot cathode network as a pumping device permits modulated, pulsed or continuous uses. For this purpose it is merely necessary to adequately control the conductors of the network.

The invention is not limited to the embodiments described and represented and covers all variants thereof. Thus, it is possible to add to the laser a protective box having an outlet window. It is also possible to use other cold electron sources and other processes and materials for the assembly of the laser device, whilst respecting the principles and advantages of the invention. The semiconductor can also be made from other alloys, other heterostructures, from a solid material or in thin film form. The cavity can be of the Fabry-Perot or distributed type, whilst the guidance structure can be a gain or index guidance structure. The focussing electrodes and the number thereof can be modified. The device can function in the continuous, pulsed or modulated mode between 77 and 300K, or at approximately ambient temperature.

We claim:

1. A laser apparatus comprising a semiconductor for emitting a coherent beam upon the application of an electron beam to said semiconductor, and an electron bombardment pumping device for applying said electron beam to said semiconductor, said bombardment device comprising at least one microdot emissive cathode cold electron source, having a volume less than 1 $cm^3$.

2. An apparatus according to claim 1, wherein said semiconductor comprises a doped semiconductor having an electronic threshold current density below 10 $A/cm^2$ and an electron acceleration voltage below 30 kV.

3. An apparatus according to claim 1, wherein said semiconductor comprises a heterostructure having at least three zones, a surface zone for electronic excitation and generation of electron-hole pairs, an active zone underlying said surface zone for the confinement of said electron-hole pairs and for generation of a coherent light beam resulting from radiative recombination of said electron-hole pairs, and a coherent light optical confinement zone underlying said active zone.

4. An apparatus according to claim 3, wherein said surface zone has a gap gradient which decreases from said surface to said active confinement zone.

5. An apparatus according to claim 3, wherein said optical and active confinement zones coincide.

6. An apparatus according to claim 3, wherein said optical confinement zone has a decreasing gap gradient.

7. An apparatus according to claim 3, wherein said first confinement zone has a first gap gradient such that said plurality of electron-hole pairs entering from said excitation zone substantially migrate toward said active zone; said active zone has a second gap gradient such that said plurality of electron-hole pairs entering said active zone from said active confinement zone substantially recombine thereby causing the emission of said coherent light beam; and said optical confinement zone has a third gap gradient such that substantially all of said plurality of electron-hole pairs migrating from said active zone to said active confinement zone return to said active zone.

8. An apparatus according to claim 1, further comprising a vacuum enclosure having first and second internal faces; said first internal face supporting said bombardment pumping device in said enclosure, and said second internal face supporting said semiconductor device in said enclosure, said second face being at a predetermined distance from said bombardment device and being oriented such that said electron beam emitted from said bombardment device strikes said semiconductor, said second face also being mounted on an electrode of predetermined shape, said enclosure having at least one transparent window adapted to allow said coherent beam to pass therethrough.

9. An apparatus according to claim 8, wherein said electrode has a predetermined shape for focusing said electron beam onto said semiconductor.

10. An apparatus according to claim 8, and further comprising a cooling device in functional contact with said apparatus.

11. An apparatus according to claim 8, and further comprising means for focussing said electron beam from said bombardment device onto an excitation strip.

12. An apparatus according to claim 11, wherein said excitation strip comprises a plurality of conductive screens.

13. An apparatus according to claim 8, and comprising a plurality of semiconductors each supported by a corresponding electrode.

14. An apparatus according to claim 1, and comprising a plurality of microdot emissive cathode cold electron sources arranged in a matrix, and including means for selectively activating said sources.

* * * * *